(12) United States Patent
Rajagopalan et al.

(10) Patent No.: US 8,076,250 B1
(45) Date of Patent: Dec. 13, 2011

(54) PECVD OXIDE-NITRIDE AND OXIDE-SILICON STACKS FOR 3D MEMORY APPLICATION

(75) Inventors: Nagarajan Rajagopalan, Santa Clara, CA (US); Xinhai Han, Fremont, CA (US); Ji Ae Park, Santa Clara, CA (US); Tsutomu Kiyohara, Campbell, CA (US); Sohyun Park, Santa Clara, CA (US); Bok Hoen Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/899,401

(22) Filed: Oct. 6, 2010

(51) Int. Cl.
*H01L 21/31* (2006.01)

(52) U.S. Cl. ........ 438/763; 438/712; 438/585; 438/396; 438/710; 257/E21.485; 257/E21.409; 257/288; 257/530; 427/255; 427/39

(58) Field of Classification Search .................. 438/763, 438/585, 710, 712, 396; 257/530, E21.409, 257/E21.485, 288; 427/39, 255
See application file for complete search history.

(56) References Cited

U.S. PATENT DOCUMENTS

| | | | |
|---|---|---|---|
| 5,068,124 A * | 11/1991 | Batey et al. | 427/579 |
| 5,290,609 A * | 3/1994 | Horiike et al. | 438/396 |
| 6,849,509 B2 | 2/2005 | Barnak et al. | 438/275 |
| 7,122,870 B2 | 10/2006 | Barnak et al. | 257/407 |
| 7,670,963 B2 | 3/2010 | Ramkumar et al. | 438/778 |
| 2006/0172545 A1* | 8/2006 | Hewes et al. | 438/710 |
| 2009/0212010 A1* | 8/2009 | Wang et al. | 216/47 |
| 2009/0315078 A1* | 12/2009 | Parikh et al. | 257/194 |
| 2010/0032732 A1* | 2/2010 | Booth et al. | 257/288 |
| 2011/0027999 A1* | 2/2011 | Sparks et al. | 438/712 |

\* cited by examiner

*Primary Examiner* — Jack Chiang
*Assistant Examiner* — Wilner Jean Baptiste
(74) *Attorney, Agent, or Firm* — Dergosits & Noah LLP

(57) ABSTRACT

A layer stack of different materials is deposited on a substrate in a single plasma enhanced chemical vapor deposition processing chamber while maintaining a vacuum. A substrate is placed in the processing chamber and a first processing gas is used to form a first layer of a first material on the substrate. A plasma purge and gas purge are performed before a second processing gas is used to form a second layer of a second material on the substrate. The plasma purge and gas purge are repeated and the additional layers of first and second materials are deposited on the layer stack.

20 Claims, 8 Drawing Sheets

PECVD OXIDE-NITRIDE AND OXIDE-SILICON STACKS FOR 3D MEMORY APPLICATION

FIELD OF INVENTION

The present invention relates to semiconductor substrate processing systems and, more particularly, to a process for depositing layered stacks of materials.

DESCRIPTION OF THE RELATED ART

Semiconductor substrate processing systems generally contain a process chamber having a pedestal for supporting a semiconductor substrate within the chamber proximate a processing region. The chamber forms a vacuum enclosure defining, in part, the process region. A gas distribution assembly or showerhead provides one or more process gases to the process region. The gases are then heated and/or supplied with energy to form a plasma which performs certain processes upon the substrate. These processes may include plasma enhanced chemical vapor deposition (PECVD) to deposit a film upon the substrate.

3D memory can be fabricated from a layer stack of alternating film materials that are deposited on a substrate. For example, the 3D memory can include alternating layers of oxide and nitride films or alternating layers of oxide and silicon films. These stacks can include multiple layers of a first material and a second material. In order to form these layered stacks, the substrate is placed in a first PECVD chamber and a vacuum is applied to chamber. The precursor gases are used to generate a plasma and a first material is deposited on the substrate. The chamber can be purged with an inert gas such as nitrogen and the substrate is then removed from the first PECVD chamber. The substrate is then transported to a second PECVD chamber. A vacuum is applied to the second processing chamber and precursor gases are used to generate a plasma and a second material is deposited on the substrate over the first material. The substrate is removed and the process is repeated until the required number of layers are formed on the substrate.

A problem with the described process is that it can be very inefficient to deposit each layer of material in a different processing chamber. What is needed is a method for forming multiple layers of different materials in a single processing chamber without having to break the vacuum of the processing chamber.

SUMMARY OF THE INVENTION

In an embodiment, a process for fabricating a layered stack of alternating materials is performed in-situ in a single PECVD processing chamber. A substrate is placed in a PECVD processing chamber on a grounded pedestal. A door to the processing chamber is closed to seal the chamber and a vacuum is applied to the chamber. In an embodiment, an electrode can be mounted over the pedestal in a capacitively coupled configuration. Alternating current radio frequency (RF) power can be applied to an electrode which creates an electrical field between a substrate and the electrode. A first group of process gases flows into the processing chamber and is energized into a first plasma within the PECVD chamber. The plasma has a significant percentage of the atoms or molecules that are ionized and the atoms or molecules release electrons. These energetic electrons can induce dissociation of first process gas molecules and the creation of large quantities of free radicals. This results in the deposition of a first material on the substrate.

After the first material layer is deposited, a plasma purge is performed to clean the PECVD chamber and condition the surface of the first material layer for a good interface with the next layer of material that will be deposited. A gas purge is then performed to clean out residual gas. A second group of processing gases flows into the processing chamber and is energized into a second plasma within the PECVD chamber. A layer of a second material is deposited over the first material from the second plasma. A plasma purge cleans the PECVD chamber and conditions the surface of the second material layer. A gas purge is then performed to remove the second process gases.

The described process of depositing the first and second material layers is repeated until the required number of layers have been deposited on the substrate. The efficiency of the process is improved because the deposition of the different materials is performed in the same PECVD processing chamber and throughout the deposition processes, the vacuum is maintained on the PECVD processing chamber. Thus, a substantial amount of time is saved by not having to transfer the substrate between two different PECVD processing chambers to deposit the different material layers.

The material layer stacks deposited can depend upon the type of 3D memory being fabricated. Examples of materials that can form the layered stacks include: silicon oxide/silicon nitride, silicon oxide/silicon, silicon/doped silicon, silicon/silicon nitride and other materials. After the layer stack is deposited, the substrate can be removed from the PECVD processing chamber and additional processing can be performed to fabricate the 3D memory devices. In some embodiments, the memory devices can require 8×, 16×, 24× or more layers of materials.

A potential problem with depositing material layers onto a substrate is that each layer can produce tension stress or compression stress that is applied to the substrate. The substrate can oppose the stress from the deposited layer resulting in strain deformation of the substrate which can cause the upper surface of the substrate to bow. This deformation of the upper surface of the substrate can result in errors in subsequent lithography processing. In order to minimize the deformation of the substrate, the deposited material layers can be tuned so that the net stress on the substrate is low. More specifically, the stresses of the two materials can be tuned so that they have substantially equal magnitudes and opposite directions. When the pairs of layers are deposited adjacent to each other, the equal but opposite tension or compression stresses will tend to cancel each other out so that the net stress of the substrate will very low and the substrate will not have any deformation.

Although the net stress may be close to zero, the stress between adjacent layers can be very high because the stresses are opposite. If the stresses are too high, it is possible to break the bonds between the adjacent layers resulting in delamination of a portion of the layer stack. In order to avoid delamination, the bonding of the adjacent materials must be very strong. In an embodiment, after a material is deposited a plasma treatment may be applied to the exposed surface of the material to improve the bonding interface between the adjacent layers and prevent delamination.

DETAILED DESCRIPTION

Figure 1:
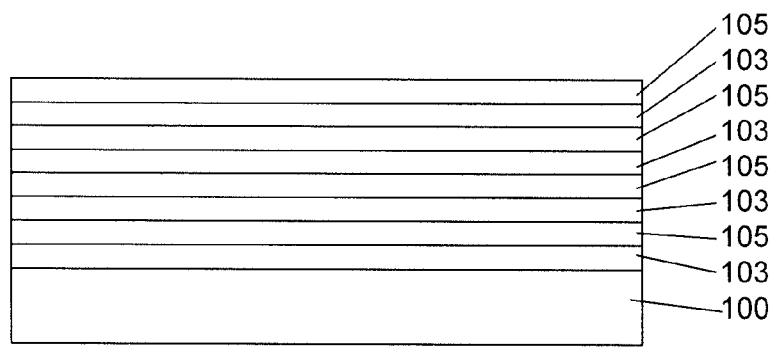
FIG. 1 illustrates a layer stack deposited on a substrate.

With reference to FIG. 1, in an embodiment, a multiple layer stack 101 is formed on a substrate 100 having a layer of a first material 103 and a layer of a second material 105. The subsequent layers can repeat this alternating pattern of first material 103 layers and the second material 105. In one embodiment, the first material can be an oxide and the second material can be a nitride. In other embodiments, the first/second material stacks can be oxide/silicon, silicon/doped silicon, or silicon/nitride. All of these combinations of materials can be used in Bit-Cost Scalable (BiCS), Terabit Cell Arry Transistor (TCAT) and other 3D memory structures. In other embodiments, the first/second material stacks can be other combinations of materials. The deposition order of the first and second material layers on the substrate can also be reversed.

The number of layers can depend upon the memory device being fabricated. In an embodiment, the stack numbers could be 8×, or 16×, or 24×, or even higher, where each stack of 8, 16, 24 or more layers corresponds to one memory device. The two layers of different materials form each stack, so the corresponding number of layers for an 8× stack number can be 16, a 16× stack number can have 32 layers, a 24× stack number can have 48 layer, and a higher stack number can have a higher number of layers.

Figure 2:
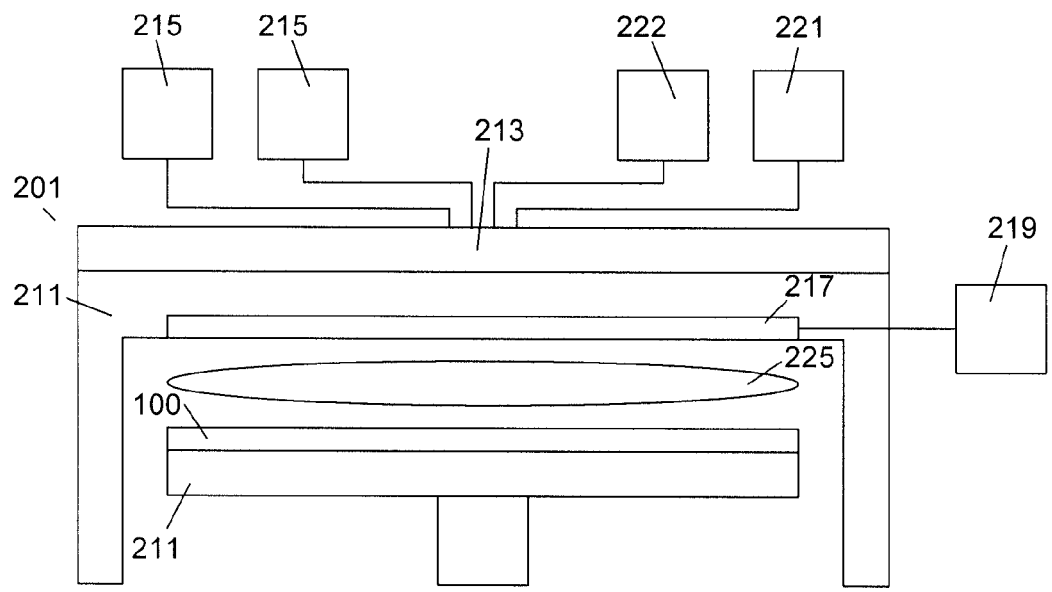
FIG. 2 illustrates a PECVD processing chamber.

With reference to FIG. 2, a PECVD processing chamber 201 is illustrated. The processing chamber 201 includes a pedestal 211, a process gas manifold 213, a process gas source 215, an electrode 217, RF power source 219 emitting an alternating current RF electrical power, a heater 221 and a purge gas source 221. In an embodiment, the electrode 217 can be directly over the pedestal 211 which is electrically grounded in a capacitively coupled configuration. In an embodiment, the electrode 217 can be a showerhead structure that has flow paths for the process gases. The process and purge gases can flow through the manifold 213 and the electrode 217 into the process chamber 201 above the pedestal.

During processing, the substrate 100 is placed on the pedestal 211 and vacuum is applied to the PECVD processing chamber 201. Energy can be applied to the heater 211 to heat the substrate 100. A first group of processing gases passes through the manifold 213 into the processing chamber 201. The electrode 217 is energized by the RF power source 219 creating an electrical field between the electrode 217 and the grounded pedestal 211. In an embodiment, the pedestal 211 can be on a variable height adjuster that allows the spacing between the top of the substrate 100 and the electrode 217 to be controlled. The first group of process gases is energized by the RF electrical field and generates a plasma 225. The plasma 225 has a significant percentage of the atoms or molecules that are ionized and the atoms or molecules release electrons. These energetic electrons can induce dissociation of precursor molecules and the creation of large quantities of free radicals. This results in the deposition of material on the substrate 100. The deposition can stop once the desired thickness of the first material is deposited. The layer thickness of the first material can be between 100 Å to 1000 Å.

After the first material is deposited on the substrate 100, the PECVD processing chamber 201 is plasma purged. A purge gas can flow from a purge gas source 221 into the manifold 213 and the processing chamber 201. The electrode 217 and pedestal 211 are energized generating a purge gas plasma. Various purge gases can be used including $NH_3$, $N_2$, $N_2O$, $H_3$, Ar and other suitable plasma purge gases. During the purge process, the heat and pressure can be maintained in the processing chamber. The plasma purge conditions the surface of the exposed layer for additional depositions. The conditioned surface results in a smooth interface between layers and better adhesion between layers, as well as better particle control. In some embodiments, a rougher interface may be desirable for better layer bonding and a different or additional plasma purge process may be performed. After the plasma purge is completed, the energy to the electrode 217 and pedestal 211 can be turned off and a gas purge from a gas purge source 222 flows into the manifold 213 and the processing chamber 201 to remove all gas contaminants. In an embodiment, one or more components of the precursor gas are stopped during the purge process. For example, if the process gas includes a mixture of $SiH_4$ and $N_2O$, the purge gas can only include $N_2O$ and the flow of $SiH_4$ is shut off. In other embodiments, a different purge gas or purge gases can be used.

After the plasma and gas purges are complete, the second material can be deposited on the substrate. The electrode 217 is energized by the RF power source 219 creating an electrical field between the electrode 217 and a second group of process gases are energized by the electrical field generating a plasma 225. The deposition can stop once the desired thickness of the second material is deposited. The layer thickness of the second material can be between 100 Å to 1000 Å. After the second material layer is deposited, the PECVD chamber can be plasma purged as described above. The energy to the electrode 217 can then be removed and the PECVD chamber is gas purged as described above. Once the plasma and gas purges are complete, the process of depositing the first material and the second material can be repeated until the required layers have been deposited. The substrate 100 can then be removed from the PECVD chamber 201 for additional processing.

The described first material and second material layer deposition process is highly time and energy efficient because the deposition of the different materials occurs in the same PECVD processing chamber. A substantial amount of time is saved because the wafer is not transferred between two PECVD processing chambers that deposit the first and second material layers. For example, the time savings of the disclosed process may be more than 50% faster than the same deposition processes using two PECVD processing chambers. Also, because only a single PECVD processing chamber is needed the vacuum that is applied to the processing chamber does not have to be broken and reapplied for each layer that is deposited, the described layer stack deposition process is more energy efficient.

Figure 3:
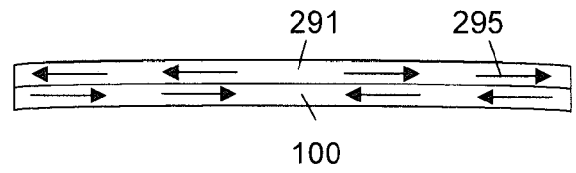
FIG. 3 illustrates a cross section of a layer having tension stress deposited on a substrate.
Figure 4:
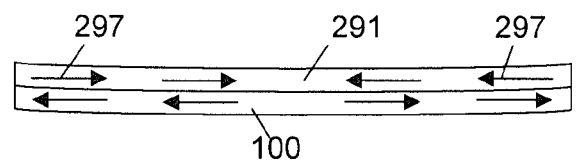
FIG. 4 illustrates a cross section of a layer having compression stress deposited on a substrate.

Another problem that can occur is that the deposition of different materials can induce compression or tension stress after being deposited on the substrate. This stress can result in bending of the substrate. With reference to FIG. 3, a layer of material 291 can be deposited on the substrate 100. The first material 291 can then expand causing compressive stress 295. The compressive stress 295 of the first material layer 291 is opposed by the substrate 100 which causes the edges of the substrate 100 to bow down. Similarly with reference to FIG. 4, a layer of a second material 293 can be deposited on the substrate 100 and the second material 293 may induce a tensile stress 297. The tensile stress 297 will also be opposed by the substrate 100 which results in the edges of the substrate 100 bending upward. Because the fabrication tolerances must be very accurate, any bending of the substrate or bumps in the substrate can result in alignment issues when a subsequent lithography processing is performed. This misalignment can result in fabrication errors and defective device construction.

In order to correct this problem, in an embodiment it is possible to tune the stress applied to the substrate by each deposited layer. The stress can be determined by the material being deposited. The stress can also be tuned within a limited range by adjusting the deposition processing conditions including process temperature, flow rates of the precursor gases, gas pressure and plasma density. For example, a cooler processing temperature can produce compressive stress and a hotter processing temperature can produce tensile stress. A lower plasma pressure can increase ion bombardment to the reaction species, and thus result a compressive stress, and conversely a higher plasma pressure can result in tensile stress. A plasma density can be increased by increasing RF power or decreasing the spacing above the substrate which can produce more ion bombardment to the reaction species can result in a compressive stress and a lower plasma density can result in tensile stress. By controlling the temperature and plasma density, the stress of the deposited materials can be predicted.

Figure 5:
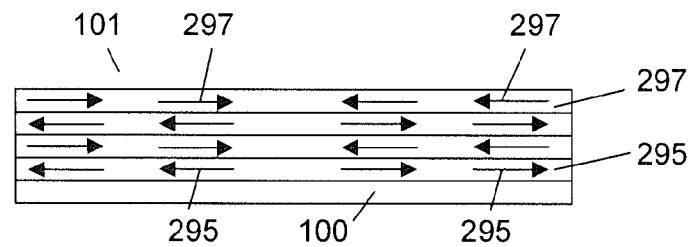
FIG. 5 illustrates a cross section of a layer stack having alternating layers of tension stress and compression stress.
Figure 6:
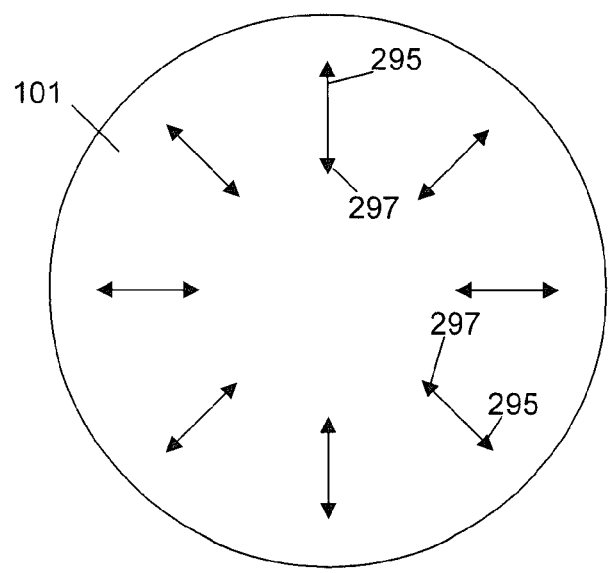
FIG. 6 illustrates a top view of a layer stack having alternating layers of tension stress and compression stress.

With reference to FIG. 5, a cross section of a multi-layer stack 101 is illustrated and FIG. 6 illustrates a top view of the multi-layer stack 101. The tension stress 295 of a first material layer 291 can be substantially equal to the compression stress 297 of a second material layer 293 is that is deposited over the first material layer 291. Because these stresses 295, 297 are in opposite directions, they effectively cancel each other out. Since there are an equal number of tension and compression layers, a total net stress the substrate 100 is close to zero.

For example, a first layer 291 of material can be silicon oxide that produces compressive stress. The second layer 293 can be a silicon nitride layer that produces tensile stress. The magnitude of the tensile stress produced by the silicon nitride second layer 293 can be substantially equal to the compressive stress of the silicon oxide first layer 291. These pairs of layers 291, 293 are deposited on top of each other resulting in a layer stack 101 that has a balanced stress with a low total net stress less than 150 MPa. This results in a substrate 100 that will not deform in strain due to the stress of the deposited layers. Because stresses are balanced, the deformation is minimized and the upper surface of the substrate 100 will be smooth and planar. A planar substrate surface is required for accurate lithography processing performed after the layers 291, 293 are deposited to form semiconductor devices such as BiSC 3D memory. A substrate 100 that is bowed or otherwise deformed will result in lithography errors.

As discussed, various combinations of materials can be deposited as layers on the substrate 100. Each of these materials can be deposited with specific process gases and specific PECVD operating conditions. The processes for depositing the layer stacks are illustrated in FIGS. 7-10 which are flow charts for deposition processes that can be used to deposit different combinations of materials in multiple layers on a substrate.

Figure 7:
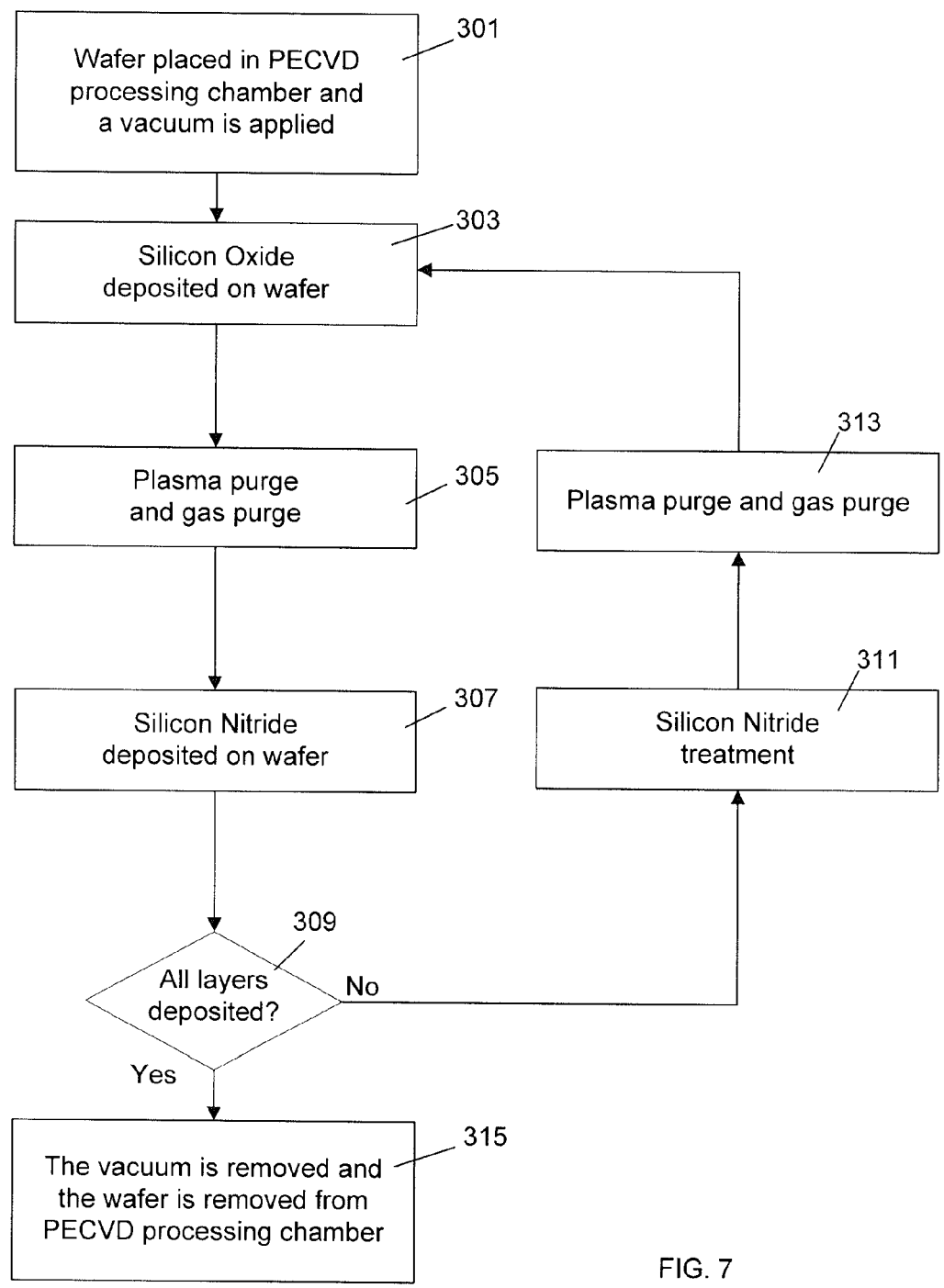
FIG. 7 illustrates a flow chart of process steps for depositing a silicon oxide/silicon nitride layer stack on a substrate.

With reference to FIG. 7, a flow chart for in-situ deposition of a layer stack of silicon oxide and silicon nitride on a substrate is illustrated. The substrate is placed in a PECVD processing chamber and a vacuum is applied to the chamber 301. The vacuum pressure in the chamber can be between about 0.5 Torr-10 Torr. The processing chamber is heated to between about 180° C.-650° C. The high frequency or RF power applied to the electrode can between about 45 watts (W)-1000 W and the spacing between the substrate and the electrode can be between about 200 mils-800 mils. The first process gases can include $SiH_4$ and $N_2O$ or other silicon containing molecules and oxygen containing molecules. The $SiH_4$ can have a flow rate of about 20 standard cubic centimeters per minute (sccm) to 1,000 sccm and the flow rate of $N_2O$ can be about 1,000 sccm to 20,000 sccm. The $SiH_4$ and $N_2O$ will be energized and converted into a plasma that contains Si and O ions. The reaction of the ions causes in a layer of silicon oxide being deposited on the substrate 303. The deposition is stopped after the required thickness of silicon oxide is deposited.

In an embodiment the surface roughness can be reduced on the silicon oxide surface by turning the plasma on before introducing the $SiH_4$ into the processing chamber. By reducing the residence time of the $SiH_4$ species, the wafer surface will be smoother which can improve the interface bond with subsequent layers that are deposited.

After the silicon oxide is deposited, the PECVD processing chamber is plasma purged and gas purged. The temperature can be between about 180° C.-650° C. and the vacuum pressure can be between about 0.5 Ton-10 Torr. The spacing can be between the substrate and the electrode can be between about 200 mils-800 mils. A purge gas of $N_2O$ can flow through the manifold into the processing chamber at a flow rate of about 2,000 sccm-30,000 sccm 305. The electrode and pedestal are energized generating a purge gas plasma with power between 100 W to 1,000 W. The plasma purging and $N_2O$ purging cleans the processing chamber and results in a smooth interface between layers, better adhesion between the deposited layers and better particle control.

After the purge is complete, the layer of silicon nitride can be deposited on the silicon oxide layer. The pressure in the chamber can be between about 0.5 Torr-10 Torr. The processing chamber is heated to between about 180° C.-650° C. The high frequency or RF power applied to the electrode can between about 50 W-700 W and the spacing between the substrate and the electrode can be between about 200 mils-800 mils. The second process gases can include $SiH_4$, $NH_3$, and $N_2$ or other silicon containing molecules and nitrogen containing molecules. The $SiH_4$ can have a flow rate of about 20 sccm to 1,000 sccm and the flow rate of $NH_3$ can be about 50 sccm to 1,000 sccm, and the flow rate of $N_2$ can be about 2,000 sccm to 30,000 sccm. The $SiH_4$, $NH_3$ and $N_2$ will be energized and converted into a plasma containing Si and N ions which will react and deposit a layer of silicon nitride on the substrate 307. The deposition is stopped after the required thickness of silicon nitride is deposited. The system will then determine that additional layers need to be deposited 309.

After the silicon nitride is deposited, a plasma treatment can be performed on the silicon nitride layer 311 to improve the bonding interface surface on the silicon nitride so that the silicon oxide layer can be securely deposited on the silicon nitride. Although the net stress of the substrate can be close to zero, the individual stresses between the adjacent layers can cause delamination if the interface bond between any of the adjacent layers is weak. The delamination of a single portion of a layer stack will result in device defects. Thus, a strong interface bond between adjacent layers is required to prevent delamination. In an embodiment, the plasma treatment performed on the silicon nitride layer can also improve the surface roughness so there will be a strong bond with the material deposited on the silicon nitride layer.

If the interface bonds between the adjacent layers are strong and the stresses of the layers are equal in magnitude and opposite in direction, the net stress on the substrate can be less than 150 MPa and the substrate will not be deformed by the stresses in the layers. Since the substrate is not deformed, after the layer stack is deposited, the upper surface will be smooth and planar. A smooth surface is required for accurate lithography processing performed after the oxide and nitride layers are deposited to form semiconductor devices such as BiSC and TCAT 3D memory. Bumps or bends in the upper surface of the layer stack 101 can result in lithography errors which can cause defects in the devices being fabricated.

In an embodiment, the plasma treatment gases can include $NH_3$ and $N_2$. The processing chamber is heated to between about 180° C.-650° C. and the vacuum pressure can be about 0.5 Torr-10 Torr. The high frequency or RF power applied to the electrode can between about 200 W-2000 W and the spacing between the substrate and the electrode can be between about 200 mils-800 mils. The $NH_3$ can have a flow rate of about 50 sccm to 1,000 sccm and the flow rate of $N_2$ can be about 2,000 sccm to 30,000 sccm. The $NH_3$ and $N_2$ are energized into a plasma that processes the surface of the silicon nitride layer to improve the interface by providing the required surface roughness. The conditioned surface provides for a good interface bond with the silicon oxide layer that will be deposited. Strong bonds between the layers will prevent delamination and prevent bending or deformation of the substrate.

After the silicon nitride plasma treatment is performed, the processing chamber is purged 313. The purge process of step 313 can be the same process described above with reference to step 305 described above using an $N_2$ purge gas at a flow rate of about 2,000 sccm-30,000 sccm. The process steps 303-313 can then be repeated until the required number of oxide and nitride layers have been deposited on the substrate 309.

In 3D memory devices, the number of layers deposited in the described manner is proportional to the number of memory transistors stacked vertically. In an embodiment, 8, 16, 24 or more transistors can be arranged vertically on the substrate. Each transistor may require a pair of adjacent layers. Thus, the required number of layers can be 16, 32 or 48 or more. After the required material layers have been deposited on the substrate, the PECVD processing chamber is brought to ambient pressure and the substrate is removed 315 from the PECVD chamber so that further processing can be performed.

Figure 8:
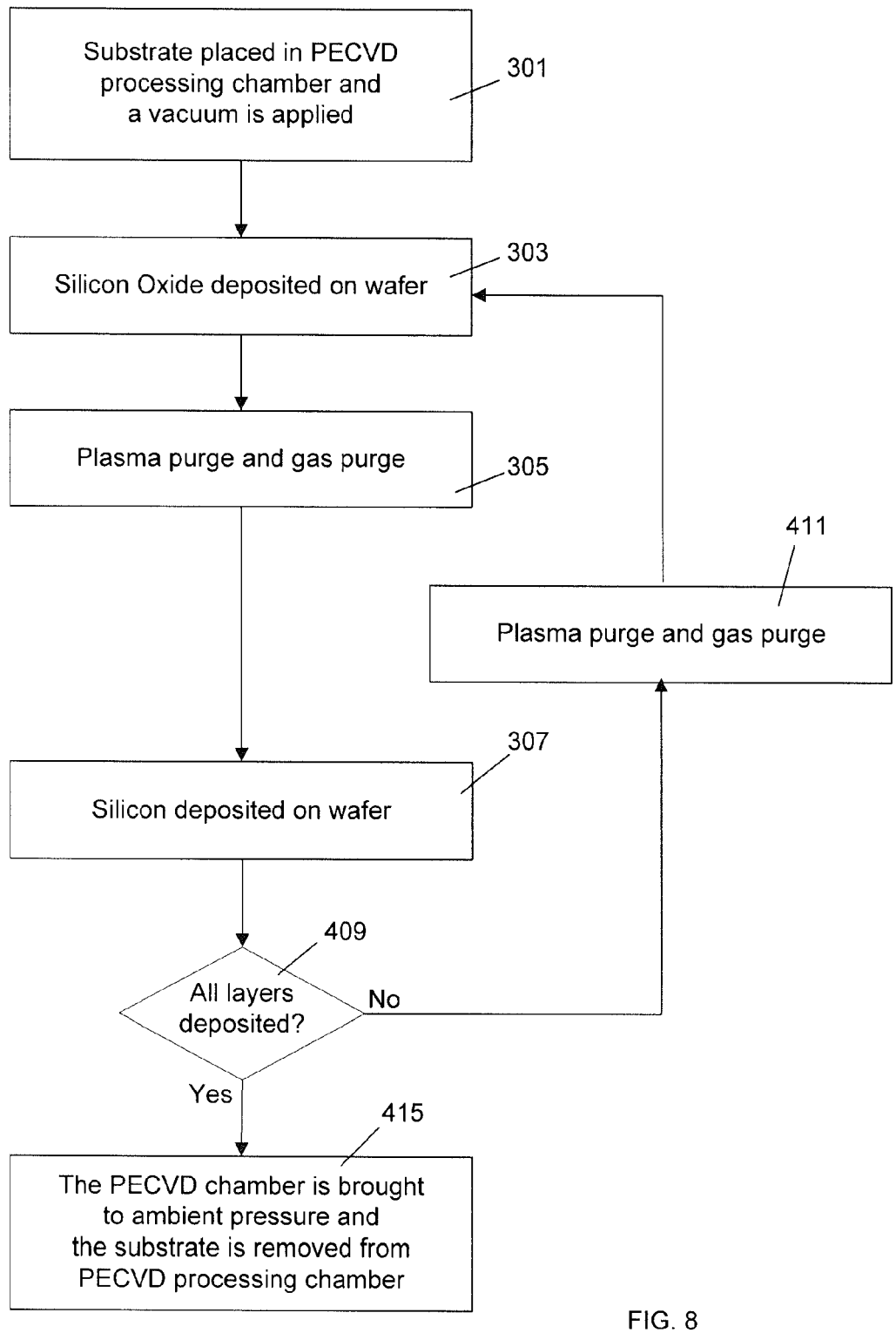
FIG. 8 illustrates a flow chart of process steps for depositing a silicon oxide/silicon layer stack on a substrate.

With reference to FIG. 8, a flow chart for in-situ deposition of a layer stack of silicon oxide and silicon on a substrate is illustrated. The substrate is placed in a PECVD processing chamber and a vacuum is applied to the chamber 401. The silicon oxide material can be deposited in the same manner described above with reference to step 303 in FIG. 7 above with the same operating conditions. The process gases can be energized and converted into a plasma that contains Si and O ions that react to cause a layer of silicon oxide to be deposited on the substrate 403. After the silicon oxide is deposited, the chamber is plasma purged and gas purged 405. The same purge process as described above in step 305 of FIG. 7 can be used.

After the processing chamber has been plasma and gas purged, the silicon layer can be deposited 407 over the silicon oxide layer. The pressure in the chamber can be between about 0.5 Torr-10 Torr. The processing chamber is heated to between about 400° C.-650° C. The high frequency or RF power applied to the electrode can between about 50 W-700 W and the spacing between the substrate and the electrode can be between about 200 mils-800 mils. The process gases can include $SiH_4$ or other silicon containing molecules and He. The $SiH_4$ can have a flow rate of about 50 sccm to 2,000 sccm and the flow rate of He can be about 1,000 sccm to 20,000 sccm. The process gases are energized to form silicon ions that react with electrons to deposit a layer of silicon. The system will determine that additional layers are required 409 and the PECVD chamber can be purged 415 in preparation for additional deposition. The process steps 403-411 can be repeated until all of the silicon oxide and silicon layers have been deposited. After the layers have been deposited 409, the PECVD chamber is brought to ambient pressure and the substrate is removed 415. For 3D memory at least eight layers of material should be deposited on the substrate. Additional processing can be performed in other processing chambers.

Figure 9:
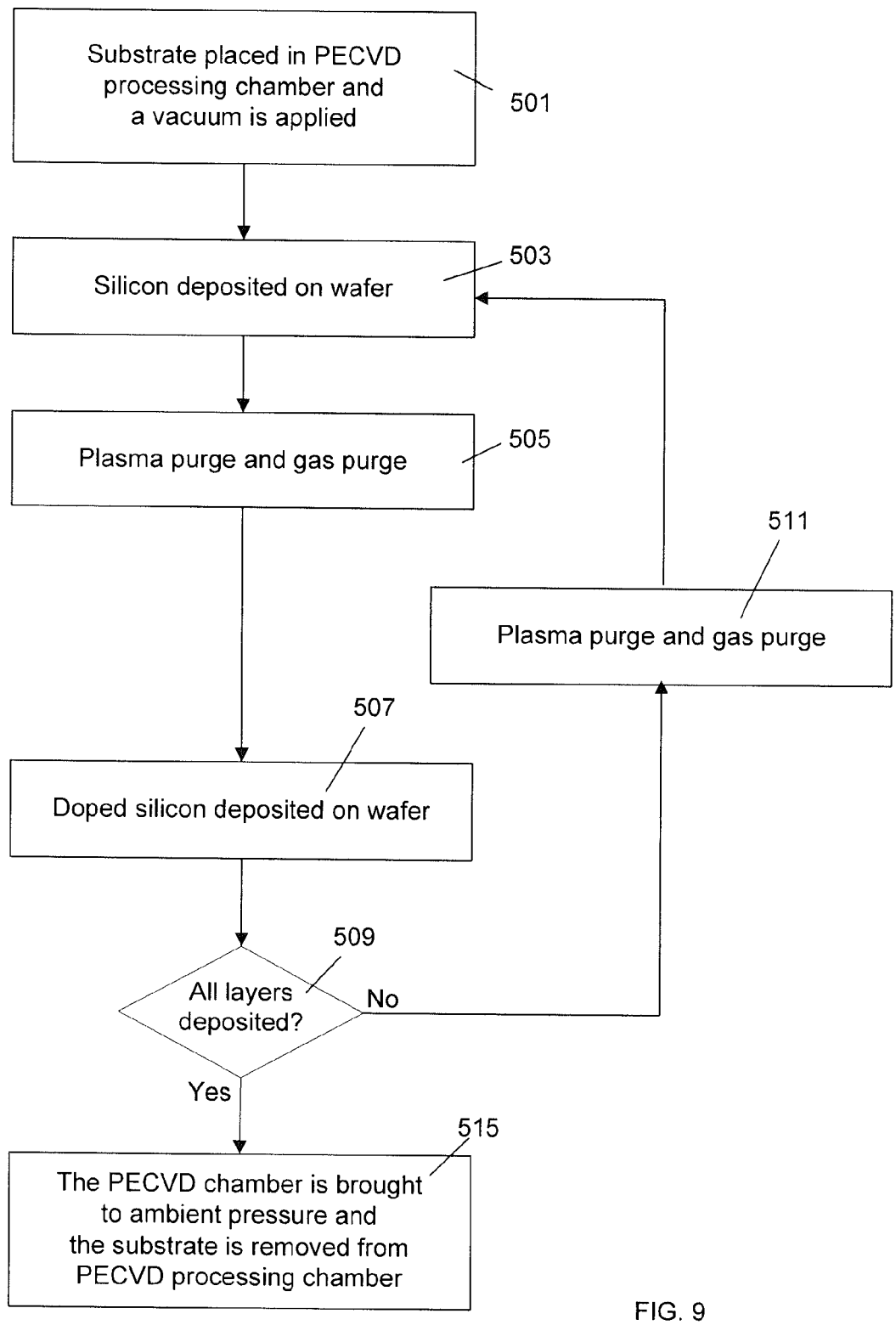
FIG. 9 illustrates a flow chart of process steps for depositing a silicon/doped silicon layer stack on a substrate.

With reference to FIG. 9, in an embodiment, a layer stack of silicon and doped silicon can be deposited on a substrate. The substrate is placed in the PECVD processing chamber and a vacuum is applied 501. The silicon material is deposited on the substrate 503. The silicon deposition process described above with reference to step 403 in FIG. 8 can be used to deposit the silicon layer. After the silicon material is deposited, the processing chamber can be plasma purged and purged 505. The purge process described above in step 305 in FIG. 7 can be used to purge the PECVD chamber.

A doped silicon material can then be deposited on the silicon layer 507 by transmitting both silicon and dopant precursors into the processing chamber. Doped silicon includes silicon and impurities which increase the electrical conductivity of the silicon. The electrical conductivity may be varied not only by the number of impurity atoms but also, by the type of impurity atoms. The doped silicon deposition processing is similar to the silicon deposition described above in step 407 of FIG. 8 described above. The process gases can include $SiH_4$, and He, as well as other dopant gases to create p-type or n-type doped silicon layers. The dopant precursor gases mix with the $SiH_4$ and $H_2$ and add impurities into the deposited silicon crystal lattice.

In order to produce p-type doped silicon, a B dopant precursor gas is required. Suitable dopant precursor gases include $B(CH_3)_3$ trimethylboron TMB and $B_2H_6$, diborane or other boron containing molecules which can flow into the processing chamber with the $SiH_4$, and He. In other embodiments, other processing gases that include boron can be used. The p-type dopant gas mix with the $SiH_4$ and He and add impurities into the deposited silicon crystal lattice. These B dopant precursor gas can have a flow rate of about 1 sccm to 50 sccm. The flow rate of the B dopant precursor gas can be proportional to the concentration of the B dopant in the p-type doped silicon layer. The deposition is stopped after the required thickness of p-type silicon is deposited. In an embodiment, boron may diffuse from the p-typed doped silicon layer. In order to minimize the boron diffusion, a thin layer of nitrogen rich material can be deposited adjacent the p-type doped silicon layer. The nitrogen rich material can prevent the diffusion of the boron from the doped silicon layer so that the required quantity of boron will remain in the doped silicon.

In order to produce n-type doped silicon, a P dopant precursor gas is required. Suitable P dopant precursor gases include $PH_3$ phosphine and other phosphorus containing molecules which can flow into the processing chamber with the $SiH_4$, and He at a flow rate of about 1 sccm to 50 sccm. In other embodiments, other phosphorus containing molecules can be used. The flow rate of the $PH_3$ can be proportional to the concentration of the P dopant in the n-type doped silicon layer. The deposition processing is stopped after the required thickness of n-type silicon is deposited.

After the doped silicon is deposited, the system can determine that additional layers are required 509 and the PECVD processing chamber can be purged 511 and steps 503-511 can be repeated until the required number of layers have been deposited 509 which can be four or more layers. All of the layers are deposited in the same PECVD processing chamber and the vacuum on the processing chamber is maintained throughout the deposition of the layers. After the silicon and doped silicon layers have been deposited, vacuum can be removed from the PECVD processing chamber and the substrate can be removed 515. Additional processing can then be performed on the wafer.

Figure 10:
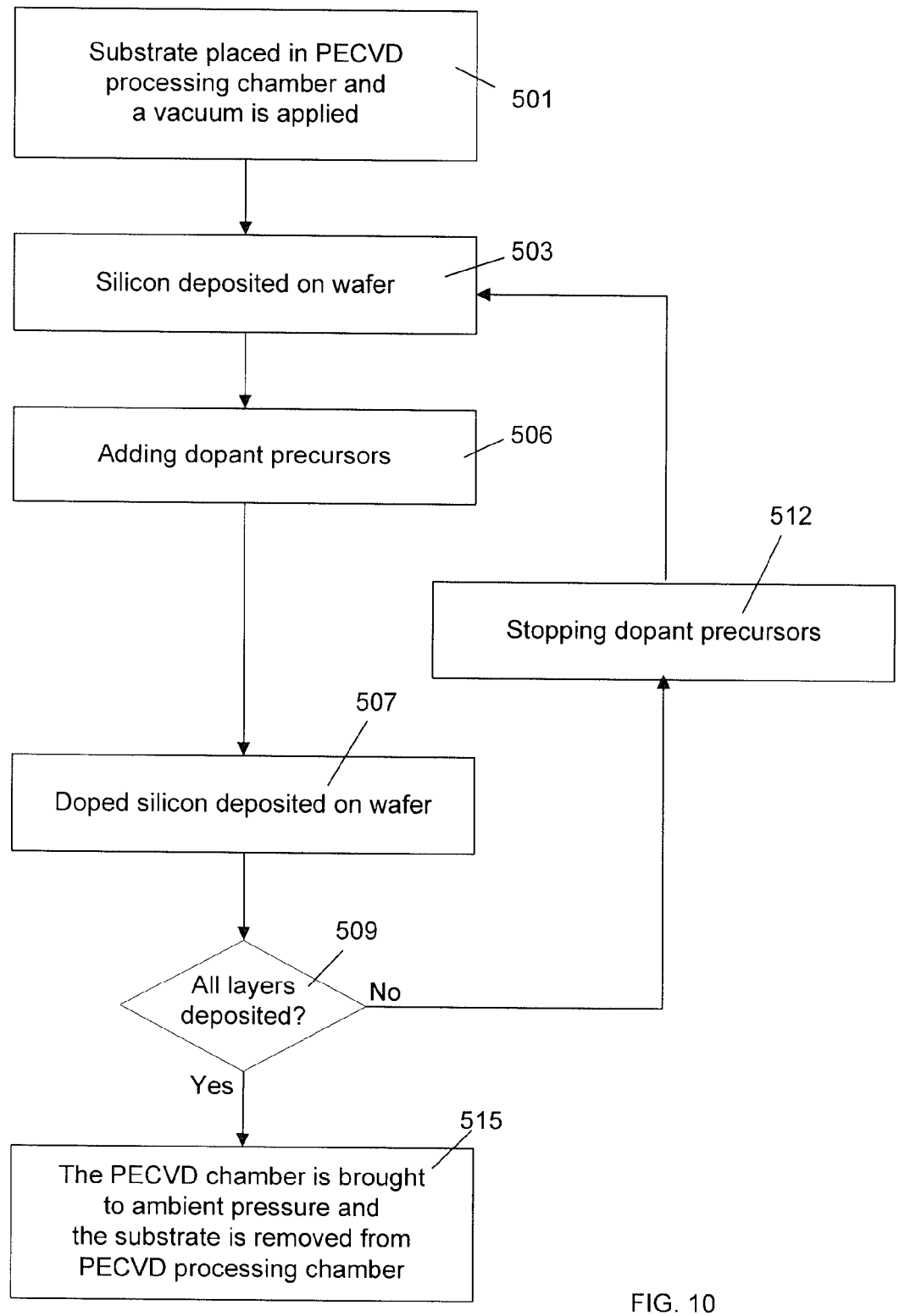
FIG. 10 illustrates a flow chart of process steps for depositing a silicon/doped silicon layer stack on a substrate.

In another embodiment, a different process can be used to deposit the layer stack of silicon and doped silicon on a wafer. The silicon plasma and doped silicon plasma can be run back to back by turning the flow rate of the dopant precursors on and off. With reference to FIG. 10, a substrate is placed in a PECVD processing chamber and a vacuum is applied 501. RF power is applied to the electrode. The silicon precursor gases flow into the processing chamber to generate a plasma and a layer of silicon is deposited on the wafer as described above with regard to FIG. 9. After the required thickness of silicon is deposited, the doped silicon is deposited. Rather than performing the plasma and gas purges, the dopant precursors 506 are added to the silicon precursors and a doped silicon is deposited on the silicon layer 507. When the required thickness of the doped silicon is deposited, the dopant precursors are stopped 512 and an additional layer of silicon is deposited on the wafer 503. The process steps 503-512 are repeated until all of the silicon/doped silicon layers are deposited 509. After the silicon and doped silicon layers have been deposited, vacuum can be removed from the PECVD processing chamber and the substrate can be removed 515 and additional processing can then be performed on the wafer. Because the plasma and gas purge steps are not required, the silicon/doped silicon layer stack deposition processing of the wafer in the described manner can be much more efficient.

In an embodiment, it can be desirable to reduce the hydrogen content of the silicon and doped silicon layers. A reduced hydrogen content can reduce outgassing during subsequent annealing processing of the wafer. The lower hydrogen content can also prevents the interface delamination in a layer stack or a hardmask structure that can contain carbon based films, metal nitrides and dielectric nitrides.

Figure 11:
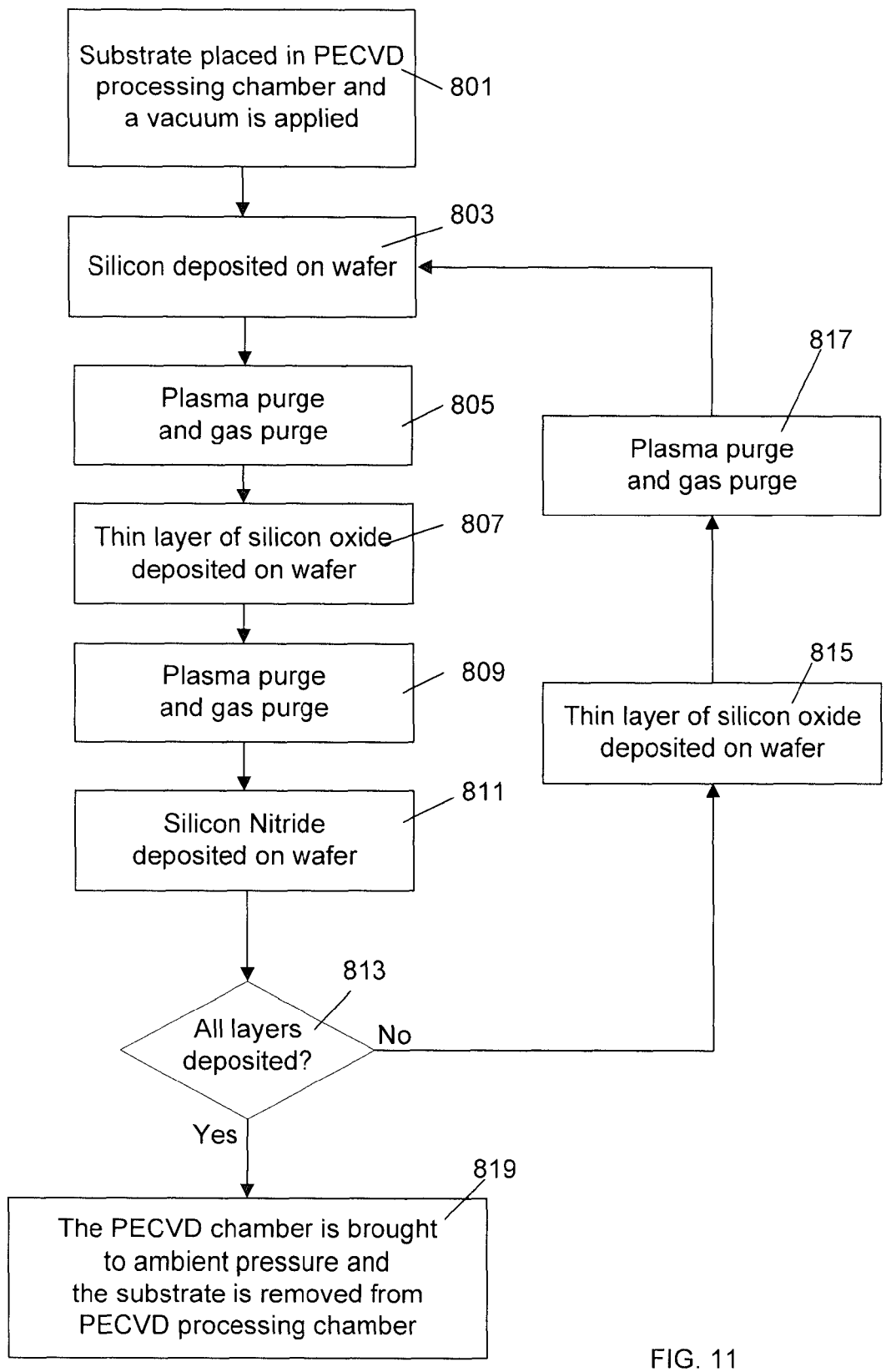
FIG. 11 illustrates a flow chart of process steps for depositing a silicon/silicon nitride layer stack on a substrate.

With reference to FIG. 11, in an embodiment, a layer stack of silicon and doped silicon can be deposited on a substrate. The substrate is placed in the PECVD processing chamber and a vacuum is applied 801. The silicon material is deposited on the substrate 803. The silicon deposition process described above with reference to step 403 in FIG. 8 can be used to deposit the silicon layer. After the silicon material is deposited, the processing chamber can be purged 805. The purge process described above in step 305 in FIG. 7 can be used to purge the PECVD chamber.

Rather than depositing the silicon nitride layer directly onto the silicon layer, a thin layer of silicon oxide can be deposited on the silicon layer 807 by introducing silicon oxide process gases into the PECVE processing chamber while RF power is applied to the electrode. The silicon oxide can function as an adhesive that improves the bond between the silicon and silicon nitride layers to prevent interface delamination during a subsequent annealing process. A thin film of silicon oxide is deposited on the silicon layer. The silicon oxide deposition process is described with reference to step 303 of FIG. 7. The chamber can then be plasma and gas purged 809 and a silicon nitride layer is deposited on the silicon oxide layer 811. A silicon nitride treatment can be performed on the silicon nitride to improve the surface roughness so that the interface is improved 815 and the plasma and gas purge 817 processes can be repeated. In an embodiment, steps 807, 809, 811, 815 and 817 are described with reference to steps 303, 305, 307, 311 and 313 in FIG. 7 respectively.

The deposition of materials can be mixed and matched. With reference to Table 1 below, possible first and second materials for the layer stack are listed. The deposition order of the first and second material layers can be changed i.e. reversed, depending on the application requirements.

TABLE 1

| First Material | Silicon Oxide | Silicon Oxide | Silicon | Silicon |
|---|---|---|---|---|
| Second Material | Silicon Nitride | Silicon | Doped Silicon | Silicon Nitride |

Figure 12:
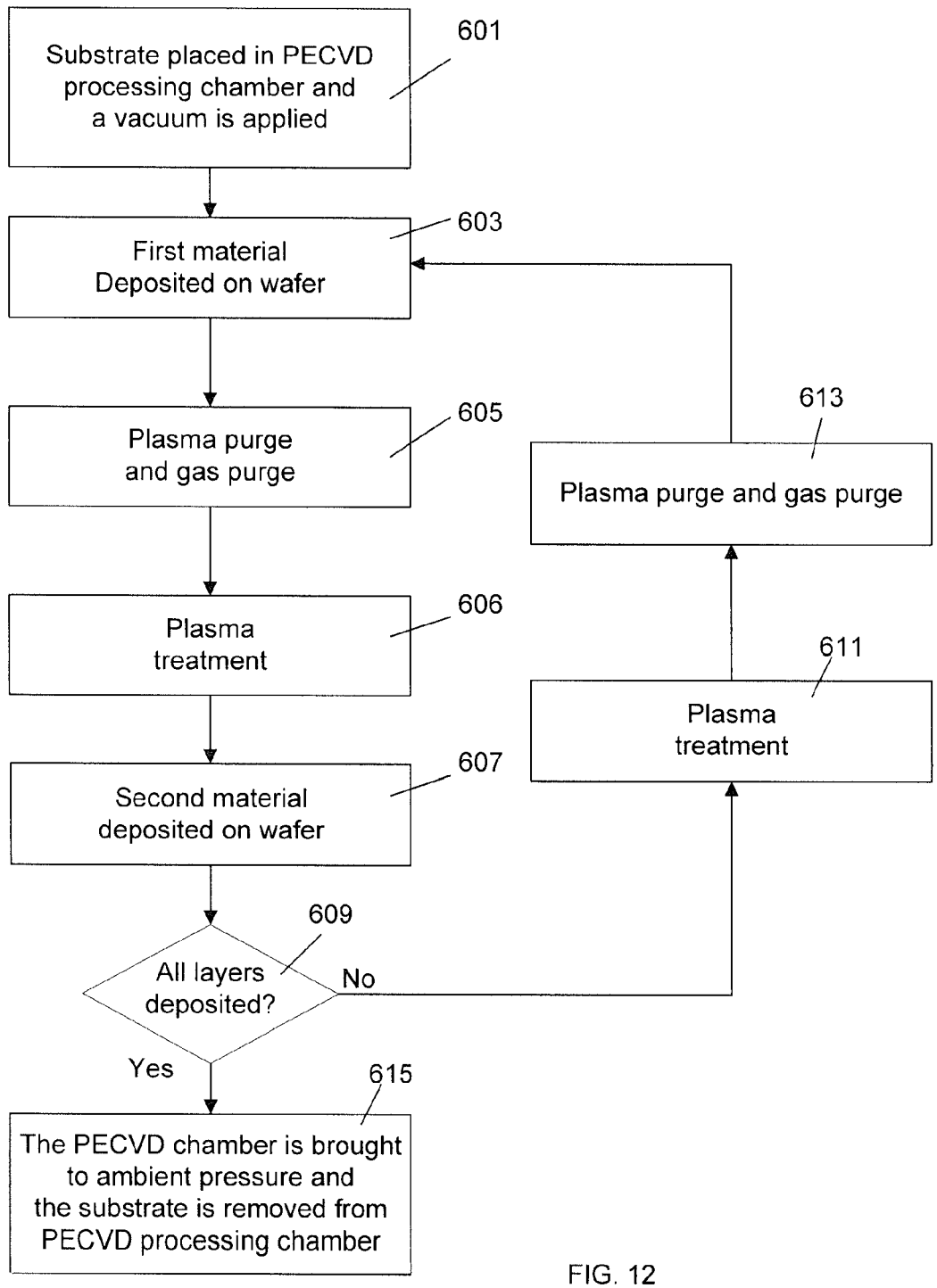
FIG. 12 illustrates a flow chart of process steps for depositing a first material/second material layer stack on a substrate.

With reference to FIG. 12, a flowchart is illustrated for in-situ depositing a layer stack of first material and a second material on a substrate. The substrate is placed in the PECVD chamber 601 and the first material is deposited on the substrate 603. The PECVD chamber is plasma purged and purged 605. If necessary a plasma treatment can be performed on the first material layer 606. A second material is deposited over the first material 607. Additional layers are deposited on the substrate 609. If necessary a plasma treatment can be performed on the second material layer 611. The PECVD chamber is purged again 613 and the process steps 603-613 are repeated to deposit additional layers on the substrate. After all layers have been deposited, the PECVD chamber is brought to ambient pressure and the substrate is removed 615. Additional etching and deposition processing can be performed to create the 3D memory device on the substrate.

It will be understood that the inventive system has been described with reference to particular embodiments, however additions, deletions and changes could be made to these embodiments without departing from the scope of the inventive system. Although the systems that have been described include various components, it is well understood that these components and the described configuration can be modified and rearranged in various other configurations.

What is claimed is:
1. A method comprising:
(a) placing a substrate in a PECVD chamber;
(b) energizing first process gases into a first plasma;
(c) depositing a layer of a first material on the substrate from the first plasma, the layer of the first material having a first stress in a first direction;
(d) plasma purging the PECVD chamber and exposing a surface of the first material to be conditioned for deposition by the plasma purge;
(e) gas purging the PECVD chamber to remove all gas contaminants;

(f) energizing second process gases into a second plasma;
(g) depositing a layer of a second material on the substrate from the second plasma, the layer of the second material having a second stress in a second direction that is opposite of the first direction;
(h) plasma purging the PECVD chamber and exposing a surface of the second material to be conditioned for deposition by the plasma purge;
(i) gas purging the PECVD chamber to remove gas contaminants;
(j) maintaining a vacuum in the PECVD chamber throughout steps (b)-(i); and
(k) repeating steps (b)-(j) until a predetermined number of layers of the first material and the second material have been deposited on the substrate and an upper surface of the substrate is planar.

2. The method of claim 1 wherein the predetermined number of layers of the first material is 8 or more and the predetermined number of layers of the second material is 8 or more.

3. The method of claim 1 wherein the gas purging of the PECVD chamber includes exposing a portion of the PECVD chamber to a purge gas selected from the group of gases consisting of: $NH_3$, $N_2$, and $N_2O$, mixtures thereof.

4. The method of claim 1 wherein the first material is silicon and the first process gases include a silicon containing molecule.

5. The method of claim 1 wherein the first material is silicon oxide and the first process gases include a silicon containing molecule and an oxygen containing molecule.

6. The method of claim 1 wherein the first material is silicon nitride and the first process gases include a silicon containing molecule and a nitrogen containing molecule.

7. The method of claim 6 further comprising:
energizing third process gases into a third plasma for surface treatment of the silicon nitride between steps (c) and (d).

8. The method of claim 7 wherein the third process gases include $NH_3$ and $N_2$.

9. A method comprising:
(a) placing a substrate in a PECVD chamber under a vacuum;
(b) energizing first process gases into a first plasma;
(c) depositing a layer of a first material having a first stress in a first direction on the substrate from the first plasma;
(d) plasma purging to clean the PECVD chamber and exposing a surface of the first material to be conditioned for deposition;
(e) gas purging the PECVD chamber to remove gas contaminants;
(f) energizing a second process gas into a second plasma;
(g) depositing a layer of a second material having a second stress in a second direction that is approximately equal in magnitude and opposite in direction to the first stress in the first direction of the first material on the substrate;
(h) plasma purging the PECVD chamber and exposing a surface of the second material to be conditioned for deposition;
(i) gas purging the PECVD chamber to remove gas contaminants;
(j) maintaining a vacuum in the PECVD chamber throughout steps (b)-(i); and
(k) repeating steps (b)-(j) until a predetermined number of layers of the first material and the second material have been deposited on the substrate and an upper surface of the substrate is planar.

10. The method of claim 9 wherein the predetermined number of layers of the first material is 8 or more and the predetermined number of layers of the second material is 8 or more.

11. The method of claim 9 wherein the gas purging of the PECVD chamber includes exposing a portion of the PECVD chamber to a purge gas selected from the group of gases consisting of: $NH_3$, $N_2$, and $N_2O$, mixtures thereof.

12. The method of claim 9 wherein the first material is silicon and the first processing gases include a silicon containing molecule.

13. The method of claim 9 wherein the first material is silicon oxide and the first processing gases include a silicon containing molecule and an oxygen containing molecule.

14. The method of claim 9 wherein the first material is silicon nitride and the first processing gas includes a silicon containing molecule and a nitrogen containing molecule.

15. The method of claim 14 further comprising:
energizing third process gases into a third plasma for surface treatment of the silicon nitride between steps (c) and (d).

16. The method of claim 15 wherein the third process gases include $NH_3$ and $N_2$.

17. method comprising:
(a) placing a substrate in a PECVD chamber under a vacuum;
(b) energizing first process gases into a first plasma;
(c) depositing a layer of a first material on the substrate from the first plasma;
(d) adding a dopant precursor to the first process gases without purging the PECVD chamber with a plasma purge or a gas purge;
(e) energizing the first process gases and the dopant precursor into a second plasma;
(f) depositing a layer of a doped silicon on the substrate from the second plasma;
(g) maintaining a vacuum in the PECVD chamber throughout steps (b)-(f); and
(h) repeating steps (b)-(g) until a predetermined number of layers of the first material and the second material have been deposited on the substrate.

18. The method of claim 17 wherein the predetermined number of layers of the first material is 8 or more and the predetermined number of layers of the second material is 8 or more.

19. The method of claim 17 wherein the second material is n-type doped silicon and the dopant precursor includes a boron containing molecule.

20. The method of claim 17 wherein the second material is p-type doped silicon and the dopant precursor includes a phosphorus containing molecule.

* * * * *